US010439565B2

(12) United States Patent
Goktepeli

(10) Patent No.: US 10,439,565 B2
(45) Date of Patent: Oct. 8, 2019

(54) LOW PARASITIC CAPACITANCE LOW NOISE AMPLIFIER

(71) Applicant: QUALCOMM Incorporated, San Diego, CA (US)

(72) Inventor: Sinan Goktepeli, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 15/976,710

(22) Filed: May 10, 2018

(65) Prior Publication Data

US 2019/0097592 A1 Mar. 28, 2019

Related U.S. Application Data

(60) Provisional application No. 62/564,155, filed on Sep. 27, 2017.

(51) Int. Cl.
| H03F 3/193 | (2006.01) |
| H03F 3/21 | (2006.01) |
| H01L 27/088 | (2006.01) |
| H04B 15/00 | (2006.01) |
| H04B 1/04 | (2006.01) |
| H01L 21/84 | (2006.01) |
| H01L 27/12 | (2006.01) |
| H04B 1/00 | (2006.01) |
| H04B 1/525 | (2015.01) |
| H03F 3/195 | (2006.01) |
| H03F 3/24 | (2006.01) |
| H03F 3/68 | (2006.01) |

(52) U.S. Cl.
CPC .............. *H03F 3/193* (2013.01); *H01L 21/84* (2013.01); *H01L 27/088* (2013.01); *H01L 27/1203* (2013.01); *H03F 3/195* (2013.01); *H03F 3/21* (2013.01); *H03F 3/245* (2013.01); *H03F 3/68* (2013.01); *H04B 1/006* (2013.01); *H04B 1/0064* (2013.01); *H04B 1/04* (2013.01); *H04B 1/525* (2013.01); *H04B 15/005* (2013.01); *H03F 2200/294* (2013.01)

(58) Field of Classification Search
USPC .................................................. 330/277, 307
See application file for complete search history.

(56) References Cited

U.S. PATENT DOCUMENTS 8,716,091 B2  5/2014 Cohen et al.
8,946,007 B2  2/2015 Doris et al.
(Continued)

FOREIGN PATENT DOCUMENTS

WO  2017052667 A1  3/2017
WO  2018031175 A1  2/2018

OTHER PUBLICATIONS

International Search Report and Written Opinion—PCT/US2018/048128—ISA/EPO—dated Nov. 27, 2018.

*Primary Examiner* — Hieu P Nguyen
(74) *Attorney, Agent, or Firm* — Seyfarth Shaw LLP

(57) ABSTRACT

A low noise amplifier (LNA) device includes a first transistor on a semiconductor on insulator (SOI) layer. The first transistor includes a source region, a drain region, and a gate. The LNA device also includes a first-side gate contact coupled to the gate. The LNA device further includes a second-side source contact coupled to the source region. The LNA device also includes a second-side drain contact coupled to the drain region.

19 Claims, 14 Drawing Sheets

(56) References Cited

U.S. PATENT DOCUMENTS

| | | | |
|---|---|---|---|
| 9,209,305 B1 * | 12/2015 | Zhang | ............... H01L 29/41733 |
| 9,530,796 B2 | 12/2016 | Stuber et al. | |
| 9,755,029 B1 | 9/2017 | Goktepeli et al. | |
| 9,755,030 B2 | 9/2017 | Radens et al. | |
| 9,780,210 B1 | 10/2017 | Goktepeli et al. | |
| 2007/0296002 A1 | 12/2007 | Liang et al. | |
| 2008/0206977 A1 | 8/2008 | Frank et al. | |
| 2014/0367753 A1 | 12/2014 | Huang et al. | |

* cited by examiner

LOW PARASITIC CAPACITANCE LOW NOISE AMPLIFIER

CROSS-REFERENCE TO RELATED APPLICATION

This application claims the benefit of U.S. Provisional Patent Application No. 62/564,155, filed on Sep. 27, 2017, entitled "LOW PARASITIC CAPACITANCE LOW NOISE AMPLIFIER," the disclosure of which is expressly incorporated by reference herein in its entirety.

TECHNICAL FIELD

The present disclosure generally relates to integrated circuits (ICs). More specifically, the present disclosure relates to a low parasitic capacitance low noise amplifier.

BACKGROUND

A wireless device (e.g., a cellular phone or a smartphone) in a wireless communication system may include a radio frequency (RF) transceiver to transmit and receive data for two-way communication. A mobile RF transceiver may include a transmit section for data transmission and a receive section for data reception of a communication signal. For data transmission, the transmit section may modulate an RF carrier signal with data to obtain a modulated RF signal, amplify the modulated RF signal to obtain an amplified RF signal having the proper output power level, and transmit the amplified RF signal via an antenna to a base station. For data reception, the receive section may obtain a received RF signal via the antenna. The receive section may amplify and process the received RF signal to recover data sent by a base station in a communication signal.

A mobile RF transceiver may include one or more circuits for amplifying these communication signals. The amplifier circuits may include one or more amplifier stages that may have one or more driver stages and one or more amplifier output stages. Each of the amplifier stages includes one or more transistors configured in various ways to amplify the communication signals. Various options exist for fabricating the transistors that are configured to amplify the communication signals transmitted and received by mobile RF transceivers.

The design of these mobile RF transceivers may include the use of semiconductor on insulator (SOI) technology for transistor fabrication. SOI technology replaces conventional semiconductor substrates with a layered semiconductor-insulator-semiconductor substrate to reduce parasitic capacitance and improve performance. SOI-based devices differ from conventional, silicon-built devices because a silicon junction is above an electrical isolator, typically a buried oxide (BOX) layer. A reduced thickness of the BOX layer, however, may not sufficiently reduce the parasitic capacitance caused by the proximity of an active device on the semiconductor layer and a semiconductor substrate supporting the BOX layer.

The active devices on the SOI layer may include complementary metal oxide semiconductor (CMOS) transistors. Unfortunately, successful fabrication of transistors using SOI technology is complicated by parasitic capacitance. For example, parasitic capacitance in the form of contact/interconnect-to-gate capacitance is caused by proximity of back-end-of-line (BEOL) interconnects and/or middle-of-line (MOL) contacts and the transistor gates. This additional capacitance causes adverse effects, such as circuit delays and losses. This additional capacitance is especially problematic for low noise amplifiers (LNAs), which may prevent support for 5G applications.

SUMMARY

A low noise amplifier (LNA) device may include a first transistor on a semiconductor on insulator (SOI) layer. The first transistor may include a source region, a drain region, and a gate. The LNA device may also include a first-side gate contact coupled to the gate. The LNA device may further include a second-side source contact coupled to the source region. The LNA device may also include a second-side drain contact coupled to the drain region.

A method of constructing a low noise amplifier (LNA) device may include fabricating a first transistor on a first surface of an isolation layer supported by a sacrificial substrate. The first transistor comprises a gate coupled to a first-side gate contact. The method may also include depositing a first-side dielectric layer on the first transistor. The method may further include bonding a handle substrate to the first-side dielectric layer. The method may also include removing the sacrificial substrate. The method may further include exposing a second-side of a source region and a second-side of a drain region of the first transistor through a second surface opposite the first surface of the isolation layer. The method may also include depositing a second-side source contact on the second-side of the source region, and depositing a second-side drain contact on the second-side of the drain region.

A radio frequency (RF) front end module may include a low noise amplifier. The low noise amplifier may include a first transistor on a semiconductor on insulator (SOI) layer. The first transistor may include a source region, a drain region, and a gate. The low noise amplifier may also include a first-side gate contact coupled to the gate, a second-side source contact coupled to the source region, and a second-side drain contact coupled to the drain region. The RF front end module may also include an antenna coupled to an output of the low noise amplifier.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
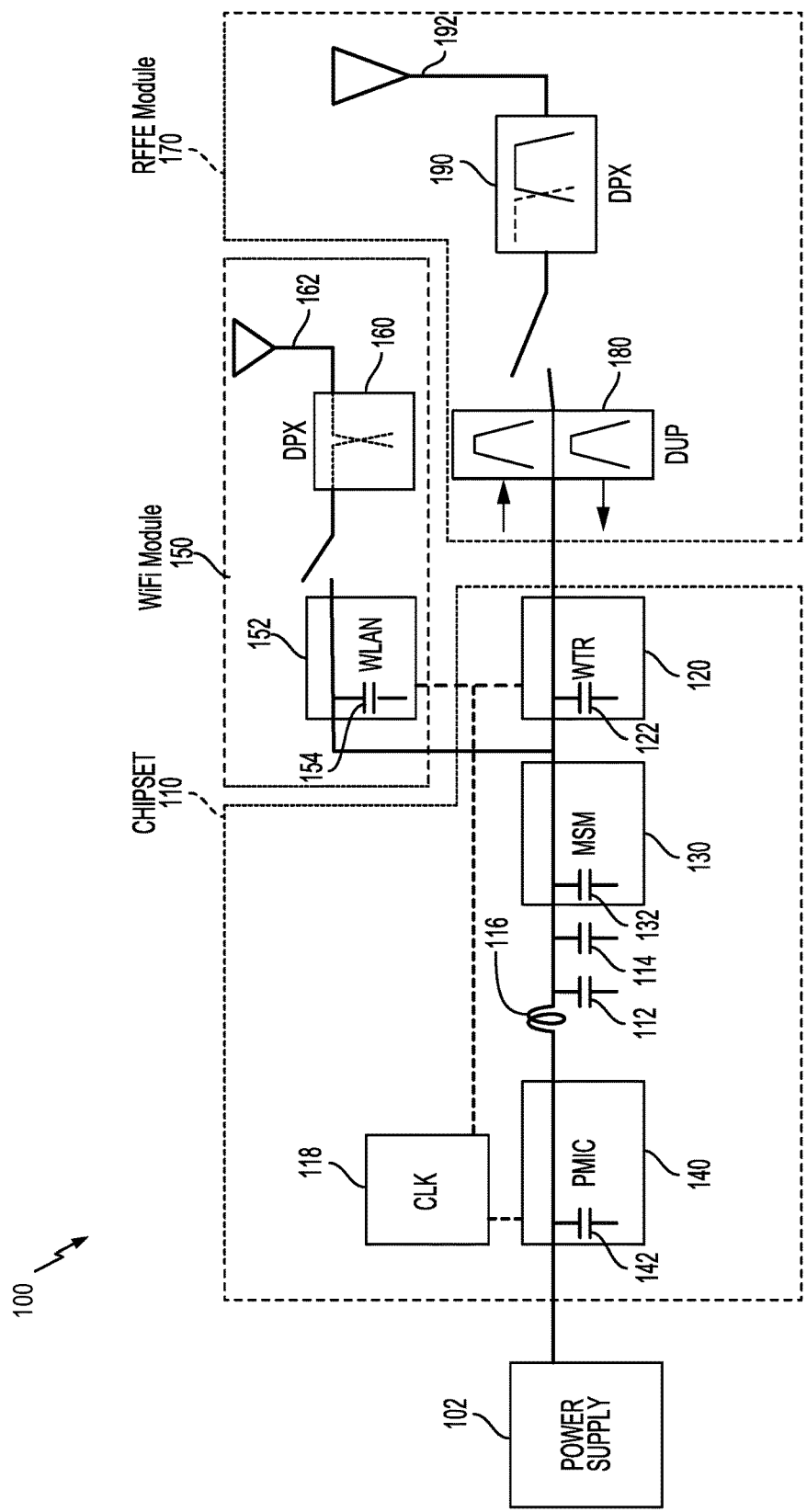
FIG. 1 is a schematic diagram of a wireless device having a wireless local area network module and a radio frequency (RF) front end module for a chipset.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR". As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Fabricating mobile radio frequency (RF) chips (e.g., mobile RF transceivers) is complex at deep sub-micron process nodes due to cost and power consumption considerations. A wireless device (e.g., a cellular phone or a smartphone) in a wireless communication system may include a mobile RF transceiver for transmitting and receiving data for two-way communication. A mobile RF transceiver may include a transmit section for transmitting data and a receive section for receiving data. For transmitting data, the transmit section may modulate an RF carrier signal with data to obtain a modulated RF signal. The transmit section amplifies the modulated RF signal for obtaining an amplified RF signal having the proper output power level and transmits the amplified RF signal to a base station through an antenna. For receiving data, the receive section may obtain a received RF signal via the antenna and may amplify and process the received RF signal to recover data sent by the base station in a communication signal.

A mobile RF transceiver may include one or more circuits for amplifying these communication signals. The amplifier circuits may include one or more amplifier stages that may have one or more driver stages and one or more amplifier output stages. Each of the amplifier stages includes one or more transistors configured in various ways to amplify the communication signals. Various options exist for fabricating the transistors that are configured to amplify the communication signals transmitted and received by mobile RF transceivers.

The design of these mobile RF transceivers may include semiconductor on insulator (SOI) technology for fabricating transistors. SOI technology replaces conventional semiconductor substrates with a layered semiconductor-insulator-semiconductor substrate for reducing parasitic capacitance and improving performance. SOI-based devices differ from conventional, silicon-built devices because a silicon junction is above an electrical isolator, typically a buried oxide (BOX) layer. A reduced thickness of the BOX layer in sub-micron process nodes, however, may not sufficiently reduce the parasitic capacitance caused by the proximity of an active device on the semiconductor layer and a semiconductor substrate supporting the BOX layer.

The active devices on the SOI layer may include complementary metal oxide semiconductor (CMOS) transistors. Unfortunately, successful fabrication of transistors using SOI technology is complicated by parasitic capacitance. For example, a parasitic capacitance in the form of contact/interconnect-to-gate capacitance may be caused by a proximity between back-end-of-line (BEOL) interconnects/middle-of-line (MOL) contacts and the transistor gates. This additional capacitance causes adverse effects, such as circuit delays and losses. This additional capacitance is especially problematic for low noise amplifiers (LNAs).

Various aspects of the present disclosure provide techniques for fabricating a low parasitic capacitance LNA in an RF integrated circuit. The process flow for semiconductor fabrication of the RF integrated circuit may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms chip and die may be used interchangeably.

The middle-of-line or MOL is the set of process steps that enable connection of the transistors to the back-end-of-line or BEOL interconnects (e.g., M1, M2, etc.) using MOL contacts. As noted, parasitic capacitance in the form of contact/interconnect-to-gate capacitance is caused by proximity of the BEOL interconnects/MOL contacts and the transistor gate contacts. This additional capacitance causes adverse effects, such as circuit delays and losses, which is especially problematic for LNAs. For example, drain-to-gate contact parasitic capacitance in LNAs is a substantial barrier to achieving 5G performance in RF mobile transceivers. A layer transfer process may reduce the additional capacitance by removing some of the routing from a front-side to a backside of an RF integrated circuit. Removing some of the routing, however, may not sufficiently reduce the parasitic capacitance.

Aspects of the present disclosure describe a backside silicidation design to reduce parasitic capacitance of a low noise amplifier (LNA) in an RF integrated circuit. One aspect of the present disclosure uses a backside silicidation process with layer transfer for forming a backside contact layer to the source/drain regions of an LNA transistor. The backside silicidation process may form a contact plug (e.g., a via) coupled to the source and drain regions of the LNA transistor through the backside contact layer. In this arrangement, a backside source contact plug and a backside drain contact plug extend through an isolation layer and into a backside dielectric layer (e.g., a second-side dielectric layer) supporting the isolation layer.

A post-layer transfer metallization process forms a backside metallization (e.g., a backside BEOL interconnect M1) coupled to the contact plug. In addition, a front-side metallization, distal from the backside metallization, may be coupled to a front-side gate contact of the gate of the LNA transistor. In this manner, the front-side interconnects (e.g., BEOL interconnects/MOL contacts) to the source and drain regions are moved to a backside of the LNA transistor. Rearrangement of the BEOL interconnects/MOL contacts may reduce the additional capacitance caused by the proximity of the BEOL interconnects/MOL contacts and the transistor gate contacts. Although described with respect to backside source/drain contacts and front-side gate contacts, the present disclosure is not so limited. For example, backside gate contacts and front-side source/drain contacts are contemplated.

FIG. 1 is a schematic diagram of a wireless device 100 (e.g., a cellular phone or a smartphone), having a low parasitic capacitance low noise amplifier, according to aspects of the present disclosure. The wireless device may include a wireless local area network (WLAN) (e.g., WiFi) module 150 and an RF front end module 170 for a chipset 110. The WiFi module 150 includes a first diplexer 160 communicably coupling an antenna 162 to a wireless local area network module (e.g., WLAN module 152). The RF front end module 170 includes a second diplexer 190 communicably coupling an antenna 192 to the wireless transceiver 120 (WTR) through a duplexer 180 (DUP). The wireless transceiver 120 and the WLAN module 152 of the WiFi module 150 are coupled to a modem (MSM, e.g., a baseband modem) 130 that is powered by a power supply 102 through a power management integrated circuit (PMIC) 140. The chipset 110 also includes capacitors 112 and 114, as well as an inductor(s) 116 to provide signal integrity. The PMIC 140, the modem 130, the wireless transceiver 120, and the WLAN module 152 each include capacitors (e.g., 142, 132, 122, and 154) and operate according to a clock 118. The geometry and arrangement of the various inductor and capacitor components in the chipset 110 may reduce the electromagnetic coupling between the components.

Figure 2:
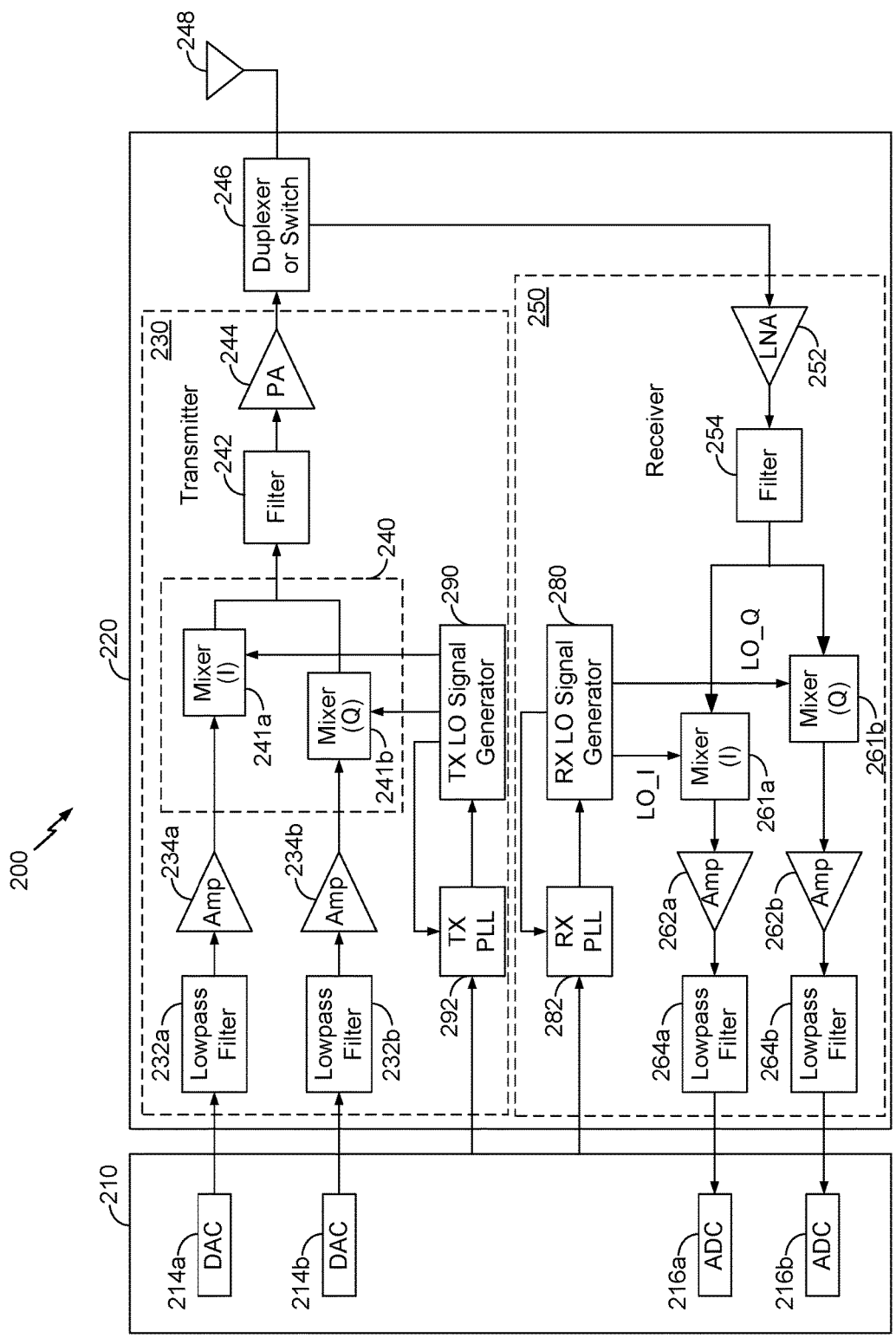
FIG. 2 shows a block diagram of an exemplary design of a wireless device, such as the wireless device shown in FIG. 1.

FIG. 2 shows a block diagram of an exemplary design of a wireless device 200, such as the wireless device 100 shown in FIG. 1, including a low parasitic capacitance low noise amplifier, according to aspects of the present disclosure. FIG. 2 shows an example of a mobile RF transceiver 220, which may be a wireless transceiver (WTR). In general, the conditioning of the signals in a transmitter 230 and a receiver 250 may be performed by one or more stages of amplifier(s), filter(s), upconverters, downconverters, and the like. These circuit blocks may be arranged differently from the configuration shown in FIG. 2. Furthermore, other circuit blocks not shown in FIG. 2 may also be used to condition the signals in the transmitter 230 and receiver 250. Unless otherwise noted, any signal in FIG. 2, or any other figure in the drawings, may be either single-ended or differential. Some circuit blocks in FIG. 2 may also be omitted.

In the example shown in FIG. 2, the wireless device 200 generally includes the mobile RF transceiver 220 and a data processor 210. The data processor 210 may include a memory (not shown) to store data and program codes, and may generally include analog and digital processing elements. The mobile RF transceiver 220 may include the transmitter 230 and receiver 250 that support bi-directional communication. In general, the wireless device 200 may include any number of transmitters and/or receivers for any number of communication systems and frequency bands. All or a portion of the mobile RF transceiver 220 may be implemented on one or more analog integrated circuits (ICs), radio frequency (RF) integrated circuits (RFICs), mixed-signal ICs, and the like.

A transmitter or a receiver may be implemented with a super-heterodyne architecture or a direct-conversion architecture. In the super-heterodyne architecture, a signal is frequency-converted between radio frequency and baseband in multiple stages, for example, from radio frequency to an intermediate frequency (IF) in one stage, and then, from intermediate frequency to baseband in another stage for a receiver. In the direct-conversion architecture, a signal is frequency converted between radio frequency and baseband in one stage. The super-heterodyne and direct-conversion architectures may use different circuit blocks and/or have different requirements. In the example shown in FIG. 2, the transmitter 230 and the receiver 250 are implemented with the direct-conversion architecture.

In a transmit path, the data processor 210 processes data to be transmitted. The data processor 210 also provides in-phase (I) and quadrature (Q) analog output signals to the transmitter 230 in the transmit path. In an exemplary aspect, the data processor 210 includes digital-to-analog-converters (DACs) 214a and 214b for converting digital signals generated by the data processor 210 into the in-phase (I) and quadrature (Q) analog output signals (e.g., I and Q output currents) for further processing.

Within the transmitter 230, lowpass filters 232a and 232b filter the in-phase (I) and quadrature (Q) analog transmit signals, respectively, to remove undesired images caused by the prior digital-to-analog conversion. Amplifiers 234a and 234b (Amp) amplify the signals from lowpass filters 232a and 232b, respectively, and provide in-phase (I) and quadrature (Q) baseband signals. Upconverters 240 include an in-phase upconverter 241a and a quadrature upconverter 241b that upconvert the in-phase (I) and quadrature (Q) baseband signals with in-phase (I) and quadrature (Q) transmit (TX) local oscillator (LO) signals from a TX LO signal generator 290 to provide upconverted signals. A filter 242 filters the upconverted signals to reduce undesired images caused by the frequency upconversion as well as interference in a receive frequency band. A power amplifier (PA) 244 amplifies the signal from filter 242 to obtain the desired output power level and provides a transmit radio frequency signal. The transmit radio frequency signal is routed through a duplexer/switch 246 and transmitted via an antenna 248.

In a receive path, the antenna 248 receives communication signals and provides a received radio frequency (RF) signal, which is routed through the duplexer/switch 246 and provided to a low noise amplifier (LNA) 252. The duplexer/switch 246 is designed to operate with a specific receive (RX) to transmit (TX) (RX-to-TX) duplexer frequency separation, such that RX signals are isolated from TX signals. The received RF signal is amplified by the LNA 252 and filtered by a filter 254 to obtain a desired RF input signal. Downconversion mixers 261a and 261b mix the output of the filter 254 with in-phase (I) and quadrature (Q) receive (RX) LO signals (i.e., LO_I and LO_Q) from an RX LO signal generator 280 to generate in-phase (I) and quadrature (Q) baseband signals. The in-phase (I) and quadrature (Q) baseband signals are amplified by amplifiers 262a and 262b and further filtered by lowpass filters 264a and 264b to obtain in-phase (I) and quadrature (Q) analog input signals, which are provided to the data processor 210. In the exemplary configuration shown, the data processor 210 includes analog-to-digital-converters (ADCs) 216a and 216b for converting the analog input signals into digital signals for further processing by the data processor 210.

In FIG. 2, the transmit local oscillator (TX LO) signal generator 290 generates the in-phase (I) and quadrature (Q) TX LO signals used for frequency upconversion, while a receive local oscillator (RX LO) signal generator 280 generates the in-phase (I) and quadrature (Q) RX LO signals used for frequency downconversion. Each LO signal is a periodic signal with a particular fundamental frequency. A phase locked loop (PLL) 292 receives timing information from the data processor 210 and generates a control signal used to adjust the frequency and/or phase of the TX LO signals from the TX LO signal generator 290. Similarly, a PLL 282 receives timing information from the data processor 210 and generates a control signal used to adjust the frequency and/or phase of the RX LO signals from the RX LO signal generator 280.

The wireless device 200 may support carrier aggregation and may (i) receive multiple downlink signals transmitted by one or more cells on multiple downlink carriers at different frequencies and/or (ii) transmit multiple uplink signals to one or more cells on multiple uplink carriers. For intra-band carrier aggregation, the transmissions are sent on different carriers in the same band. For inter-band carrier aggregation, the transmissions are sent on multiple carriers in different bands. Those skilled in the art will understand, however, that aspects described herein may be implemented in systems, devices, and/or architectures that do not support carrier aggregation.

The mobile RF transceiver 220 of the wireless device 200 generally includes the transmitter 230 and the receiver 250 to transmit and receive data for two-way communication. The receiver 250 may include one or more circuits for amplifying communication signals, such as the LNA 252. The LNA 252 may include one or more amplifier stages that may have one or more driver stages and one or more amplifier output stages. Each of the amplifier stages includes one or more transistors configured in various ways to amplify the communication signals. Various options exist for fabricating the transistors that are configured to amplify the communication signals transmitted and received by the mobile RF transceiver 220.

The mobile RF transceiver 220 and the RF front end module 170 (FIG. 1) may be implemented using semiconductor on insulator (SOI) technology for fabricating transistors of the mobile RF transceiver 220 and the RF front end module 170. Using SOI technology helps reduce high order harmonics in the RF front end module 170. SOI technology replaces conventional semiconductor substrates with a layered semiconductor-insulator-semiconductor substrate for reducing parasitic capacitance and improving performance. SOI-based devices differ from conventional, silicon-built devices because a silicon junction is above an electrical isolator, typically a buried oxide (BOX) layer. A reduced thickness of the BOX layer in sub-micron process nodes, however, may not sufficiently reduce the parasitic capacitance caused by the proximity of an active device on the semiconductor layer and a semiconductor substrate supporting the BOX layer. As a result, a layer transfer process is introduced to further separate the active device from the substrate, as shown in FIG. 3.

Figure 3:
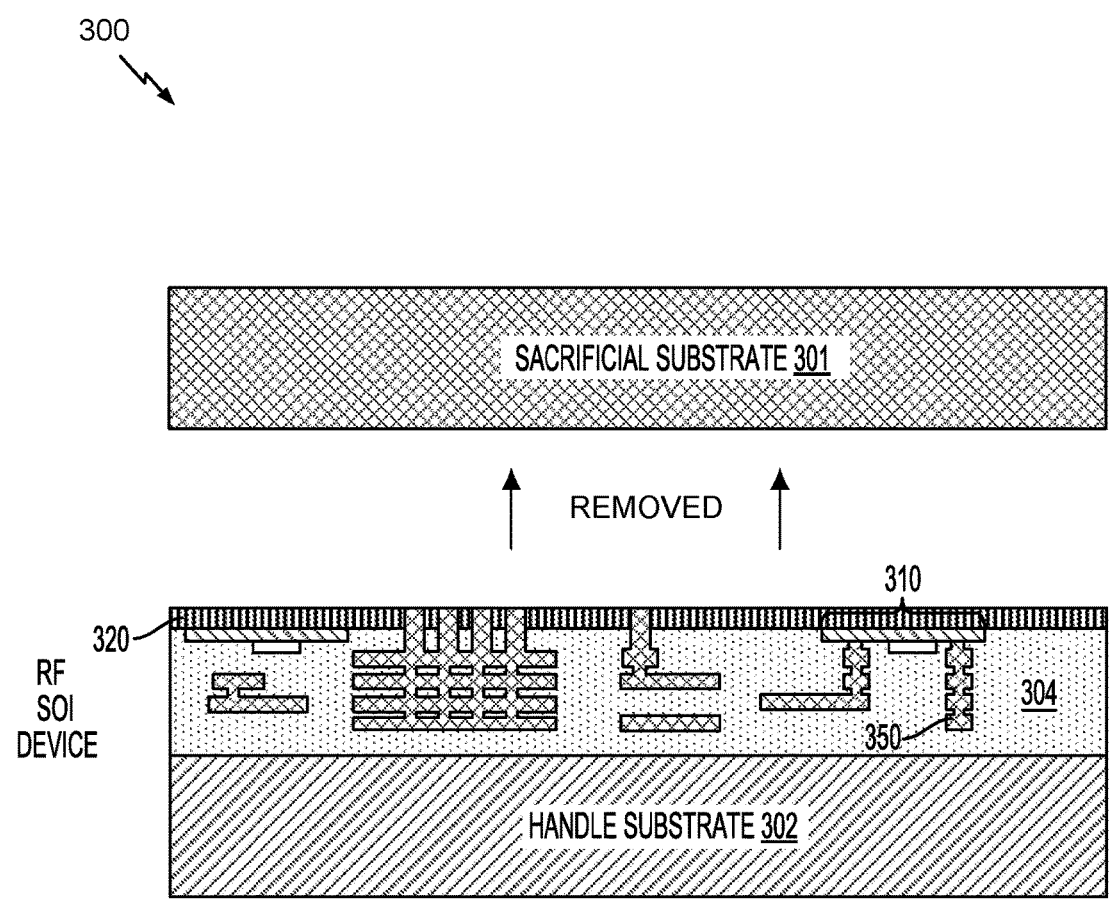
FIG. 3 shows a cross-sectional view of a radio frequency (RF) integrated circuit fabricated using a layer transfer process, according to aspects of the present disclosure.

FIG. 3 shows a cross-sectional view of a radio frequency (RF) integrated circuit 300 fabricated using a layer transfer process, according to aspects of the present disclosure. As shown in FIG. 3, an RF SOI device includes an active device 310 on a buried oxide (BOX) layer 320 that is initially supported by a sacrificial substrate 301 (e.g., a bulk wafer). The RF SOI device also includes interconnects 350 coupled to the active device 310 within a first dielectric layer 304. In this configuration, a handle substrate 302 is bonded to the first dielectric layer 304 of the RF SOI device and the sacrificial substrate 301 is removed (see arrows). In addition, bonding of the handle substrate 302 enables removing of the sacrificial substrate 301. Removal of the sacrificial substrate 301 using the layer transfer process enables high-performance, low-parasitic RF devices by increasing the dielectric thickness. That is, a parasitic capacitance of the RF SOI device is proportional to the thickness of the first dielectric layer 304, which determines the distance between the active device 310 and the handle substrate 302.

Figure 4:
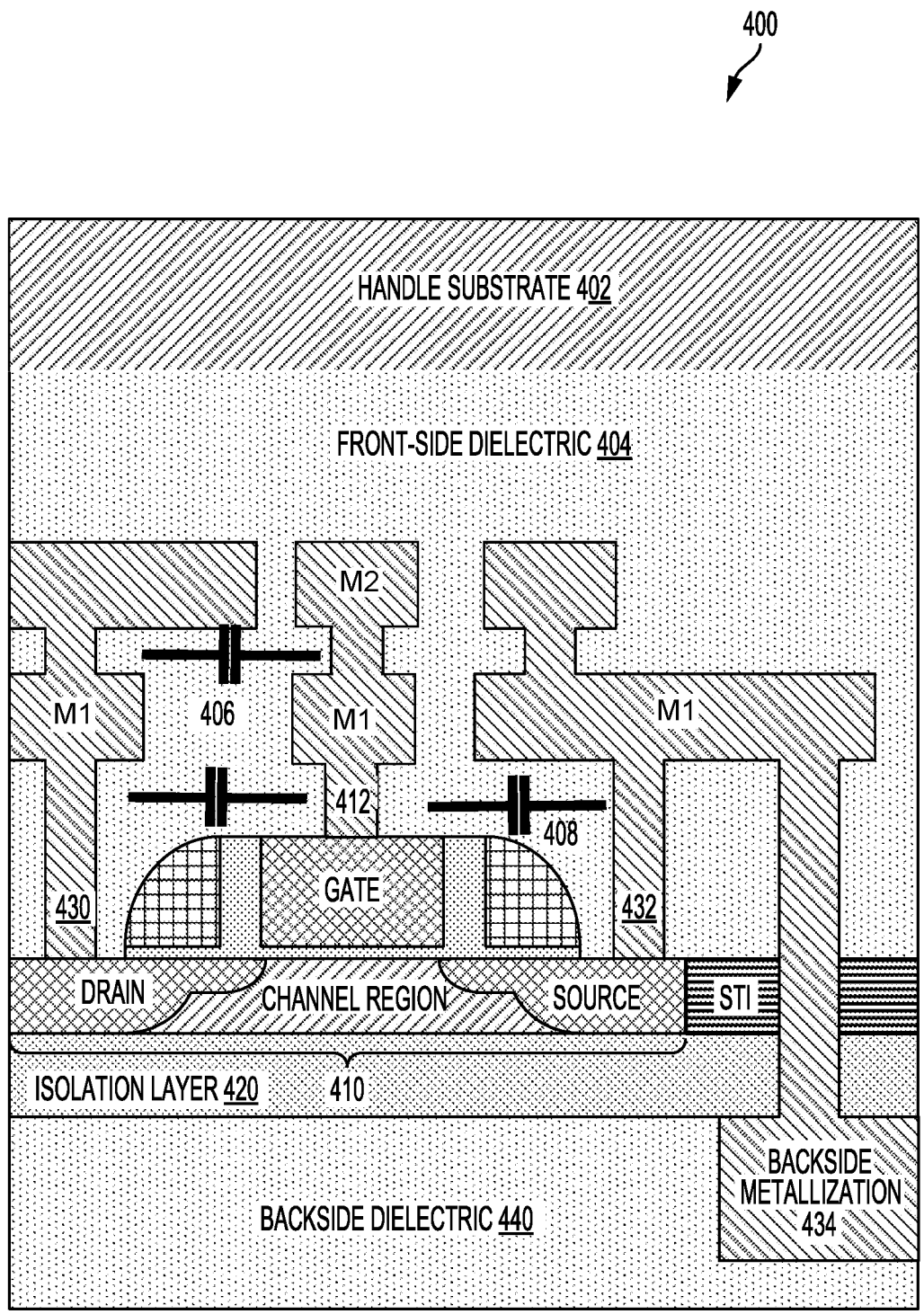
FIG. 4 is a cross-sectional view of a radio frequency (RF) integrated circuit fabricated using a layer transfer process.

The active device 310 on the BOX layer 320 may be a complementary metal oxide semiconductor (CMOS) transistor. Unfortunately, successful fabrication of CMOS transistors using SOI technology is complicated by parasitic capacitance. For example, parasitic capacitance in the form of contact/interconnect to-gate-capacitance may be caused by a proximity between back-end-of-line (BEOL) interconnects/middle-of-line (MOL) contacts and the transistor gate contacts, for example, as shown in FIG. 4. This additional capacitance causes adverse effects, such as circuit delays and losses. This additional capacitance is especially problematic for low noise amplifiers (LNAs), such as the LNA 252 of the mobile RF transceiver 220 of FIG. 2.

FIG. 4 is a cross-sectional view of an RF integrated circuit 400 fabricated using a layer transfer process. The RF integrated circuit 400 includes an active device 410 having a gate, a source region, a drain region, and a channel region. The channel region is between the source and drain regions of a semiconductor layer (e.g., a semiconductor on insulator (SOI) layer) that is formed on an isolation layer 420. In SOI implementations, the isolation layer 420 is a buried oxide (BOX) layer, and the channel, source and drain regions are formed from an SOI layer (e.g., silicon) including shallow trench isolation (STI) regions supported by the isolation layer 420.

The RF integrated circuit 400 also includes middle-of-line (MOL) interconnects (e.g., a front-side drain contact 430 and a front-side source contact 432) and back-end-of-line (BEOL) interconnects (e.g., M1, M2) coupled to the source/ drain regions of the active device 410. As described, the MOL/BEOL layers are referred to as front-side layers. By contrast, the layers supporting the isolation layer 420 may be referred to as backside layers. According to this nomenclature, a front-side metallization M1 is coupled to the source region and drain region of the active device 410 and arranged in a front-side dielectric layer 404 (e.g., a first-side dielectric layer) to which a handle substrate 402 is coupled. In this example, a backside dielectric 440 is adjacent to and possibly supports the isolation layer 420. A backside metallization 434 is coupled to the front-side metallization M1. The front-side metallization M1 is a front-side back-end-of-line (BEOL) interconnect (e.g., a first-side back-end-of-line (BEOL) interconnect) and the backside metallization 434 is a backside BEOL interconnect (e.g., a second-side BEOL interconnect).

Operation of the active device 410 is adversely affected by drain-to-gate parasitic capacitance 406 and source-to-gate parasitic capacitance 408. In this example, contact/interconnect-to-gate parasitic capacitance (e.g., 406 and 408) is caused by a proximity of the front-side drain contact 430 and the front-side source contact 432 to a gate contact 412 to the gate of the active device 410. The drain-to-gate parasitic capacitance 406 leads to adverse effects, such as circuit delays and losses. The drain-to-gate parasitic capacitance 406 is especially problematic for low noise amplifiers, such as the LNA 252 shown in FIG. 2.

Figure 5:
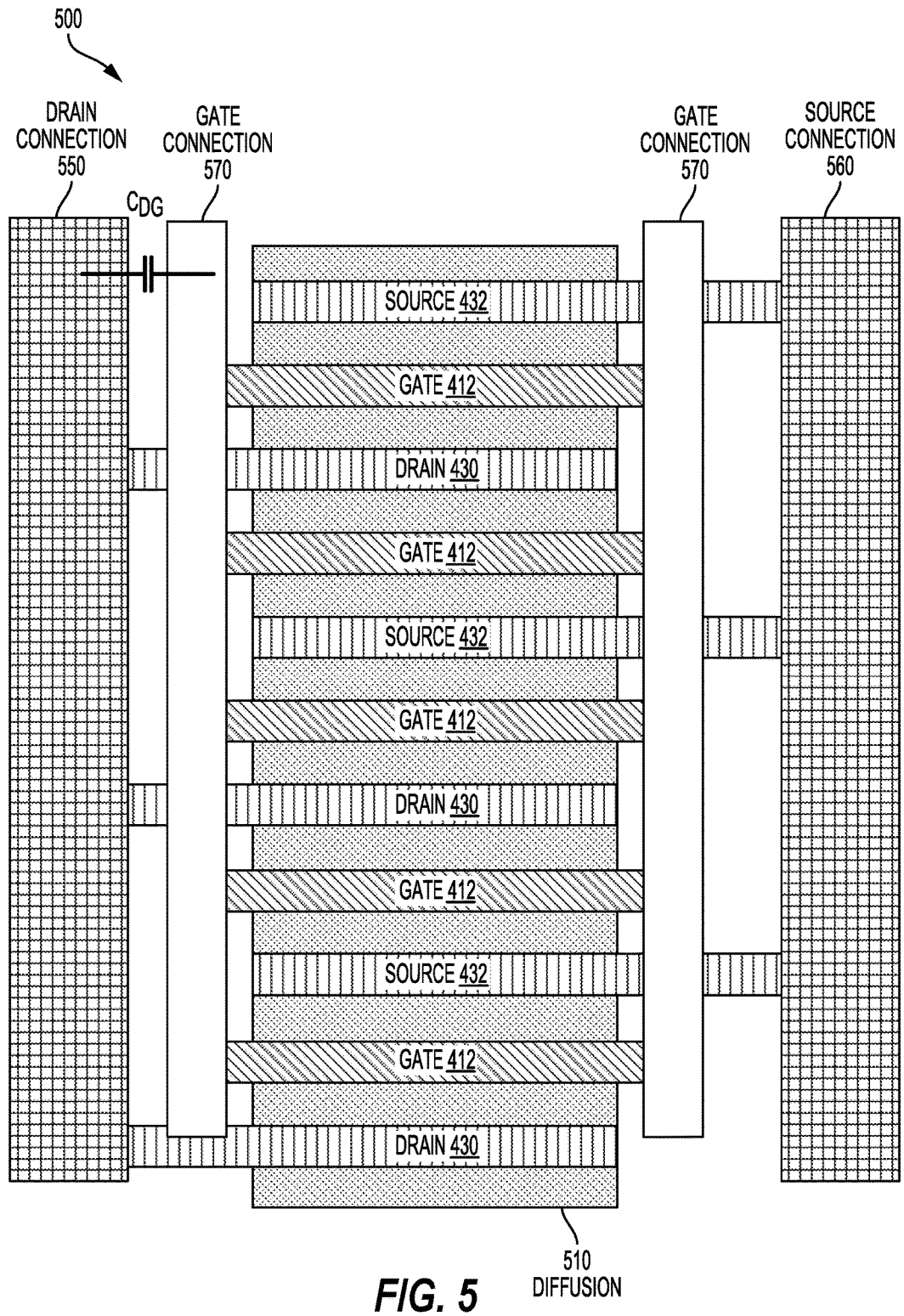
FIG. 5 illustrates routing for the source, drain and gate contacts of the RF integrated circuit of FIG. 4.

FIG. 5 illustrates routing 500 for the source, drain and gate contacts of the RF integrated circuit 400 of FIG. 4. Conventionally, access to active devices, formed during a front-end-of-line process, is limited to a front-side of the active device. For example, middle-end-of-line processing provides contacts between the gates and source/drain regions of the active devices and back-end-of-line interconnect layers (e.g., M1, M2, etc.). FIG. 5 illustrates routing of the gate contact 412, the front-side drain contact 430 and the front-side source contact 432 on a diffusion region 510 to a gate connection 570, a drain connection 550, and a source connection 560, respectively.

Conventionally, transistor gates are routed through connections at a second BEOL interconnect layer (M2), and source/drain connections are routed using a first BEOL interconnect layer (M1). When these source/drain contacts, as well as the gate contacts, are located on a front-side of a transistor, the M1 BEOL interconnects and the M2 BEOL interconnects crisscross multiple times. In particular, overlapping of the gate contact 412 and the front-side drain contact 430 when routing to a drain connection 550 and a gate connection 570 is especially problematic. Overlapping routing of the gate contact 412 and the front-side drain contact 430 produces significant drain-to-gate capacitance ($C_{DG}$) as well as increased gate resistance, thereby substantially degrading LNA performance.

Various aspects of the disclosure provide techniques for post layer transfer processing on a backside of active devices of an RF integrated circuit (RFIC). By contrast, access to active devices, formed during a front-end-of-line process, is conventionally provided from a front-side during middle-of-line processing that creates contacts between the gates and source/drain regions of the active devices and back-end-of-line interconnect layers (e.g., M1, M2, etc.). Aspects of the present disclosure involve post layer transfer processing for forming a backside contact layer and backside contact plugs to source/drain regions of LNA transistors. The backside contact layer and backside contact plugs enable moving the source/drain contacts to a backside of the LNA transistors, which eliminates the contact-to-gate parasitic coupling noted above. These transistor structures may be used in LNAs, such as the LNA 252 of FIG. 2.

The layer transfer process shown in FIG. 3 may reduce the parasitic capacitance by moving some of the routing from the front-side to the backside of the RF integrated circuit 400. Various aspects of the present disclosure provide techniques for a low parasitic capacitance LNA in an RF integrated circuit, as described in FIGS. 6A-8B.

Figure 6A:
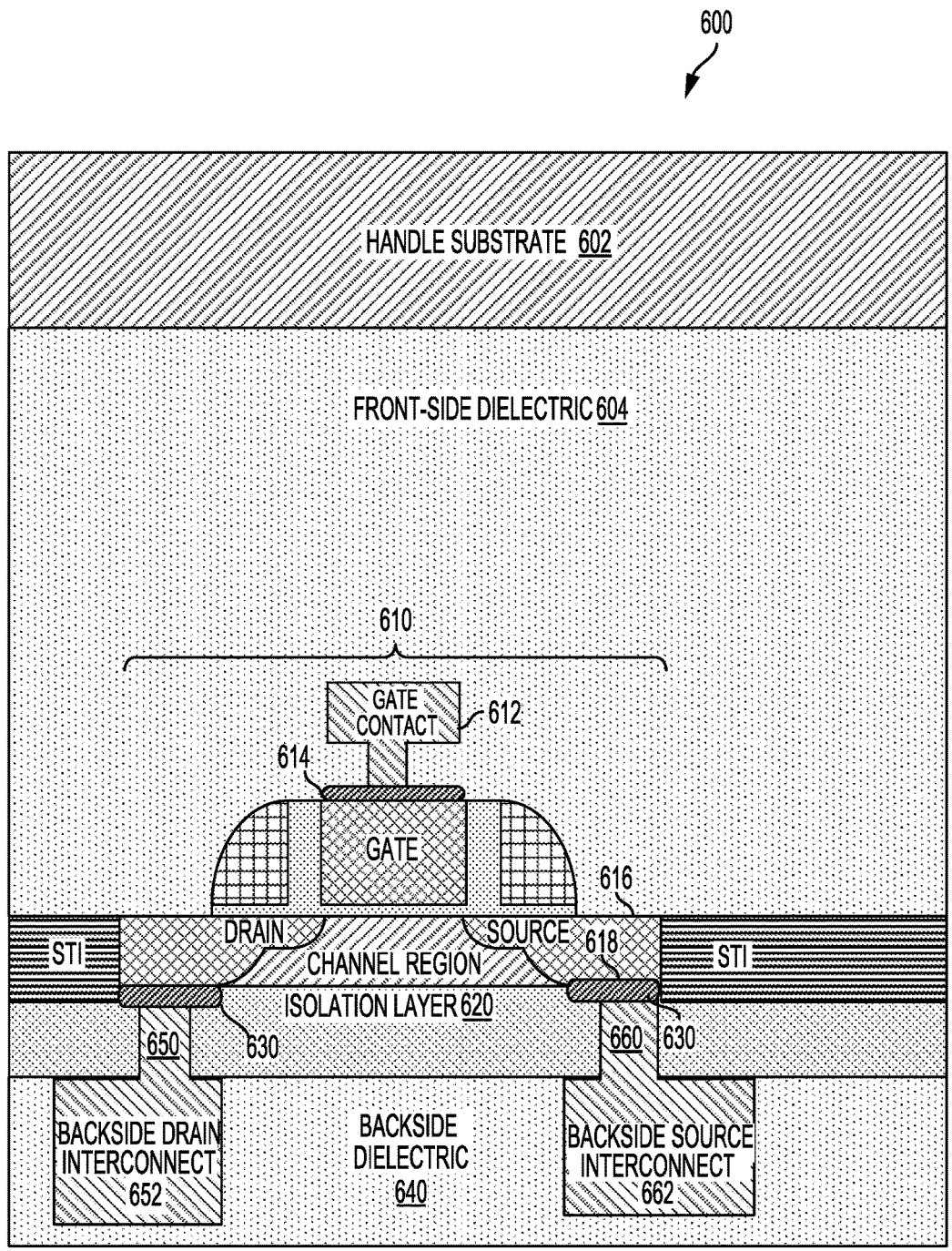
FIGS. 6A and 6B are cross-sectional views of an RF integrated circuit (RFIC), including a transistor of a low parasitic capacitance low noise amplifier (LNA), according to aspects of the present disclosure.

FIG. 6A is a cross-sectional view of an RF integrated circuit (RFIC) 600, including a transistor of a low parasitic capacitance low noise amplifier (LNA), according to aspects of the present disclosure. In this configuration, a post-layer transfer process is performed on a backside of source/drain (S/D) regions of an active device 610 (e.g., an LNA transistor). Representatively, the RFIC 600 includes the active device 610 having a gate, source/drain (S/D) regions, and a channel region between the source/drain regions, formed on an isolation layer 620. The isolation layer 620 may be a buried oxide (BOX) layer for a silicon on insulator (SOI) implementation, in which the channel and source/drain regions are formed from an SOI layer. In this configuration, shallow trench isolation (STI) regions are also on the isolation layer 620.

The RFIC 600 includes a gate contact 612 (e.g., zero interconnect (M0)/zero via (V0) of a middle-of-line layer) in a front-side dielectric layer 604. The gate contact 612 (e.g., a first-side gate contact) is coupled to a front-side contact layer 614 on the gate, which may be composed of a silicide contact layer (e.g., a front-side silicide layer). In this configuration, a handle substrate 602 is coupled to the front-side dielectric layer 604 to enable post-layer transfer processing on a backside of the active device 610. For example, the post-layer transfer processing enables access to a backside 618 opposite a front-side 616 of the source/drain regions of the active device 610. As a result, the front-side 616 of the source/drain regions is exposed to enable direct contact by the front-side dielectric layer 604.

According to aspects of the present disclosure, the handle substrate 602 may be composed of a semiconductor material, such as silicon. In this configuration, the handle substrate 602 may include at least one other active device. Alternatively, the handle substrate 602 may be a passive substrate to further improve harmonics by reducing parasitic capacitance. In this configuration, the handle substrate 602 may include at least one other passive device. As described, the term "passive substrate" may refer to a substrate of a diced wafer or panel, or may refer to the substrate of a wafer/panel that is not diced. In one configuration, the passive substrate is comprised of glass, quartz, sapphire, high-resistivity silicon, or other like passive material. The passive substrate may also be a coreless substrate.

According to aspects of the present disclosure, a layer transfer process, for example, as shown in FIG. 3, enables forming of a backside contact layer 630 on the backside 618 of the source/drain regions of the active device 610. The backside contact layer 630 may be composed of a backside silicide layer. Once formed, the backside contact layer 630 allows moving of front-side source/drain contacts (e.g., the front-side drain contact 430 and the front-side source contact 432 of FIG. 4) to the backside 618 of the source/drain regions. Moving the front-side source/drain contacts (e.g., the front-side drain contact 430 and the front-side source contact 432 of FIG. 4) to the backside 618 of the source/drain regions eliminates the contact/interconnect-to-gate parasitic capacitance (e.g., 406 and 408) shown in FIG. 4.

In an alternative configuration, the gate contact 612 is moved to the backside of the active device 610 and the front-side source/drain contacts are unchanged. In addition, a backside dielectric layer 640 is adjacent to and possibly supports the isolation layer 620. In this configuration, a post layer transfer metallization process forms a backside contact layer 630 on the backside 618 of the source/drain regions of the active device 610. As shown in FIG. 6A, a backside drain contact 650 (e.g., a second-side drain contact) is coupled to the backside 618 of the drain region through the backside contact layer 630. In addition, a backside source contact 660 (e.g., a second-side source contact) is coupled to the backside 618 of the source region through the backside contact layer 630. The backside drain contact 650 may be a contact plug (e.g., a middle-of-line (MOL) zero via (V0)) coupled to a backside back-end-of-line (BEOL) drain interconnect 652. Similarly, the backside source contact 660 may be a contact plug coupled to a backside BEOL source interconnect 662.

Figure 6B:
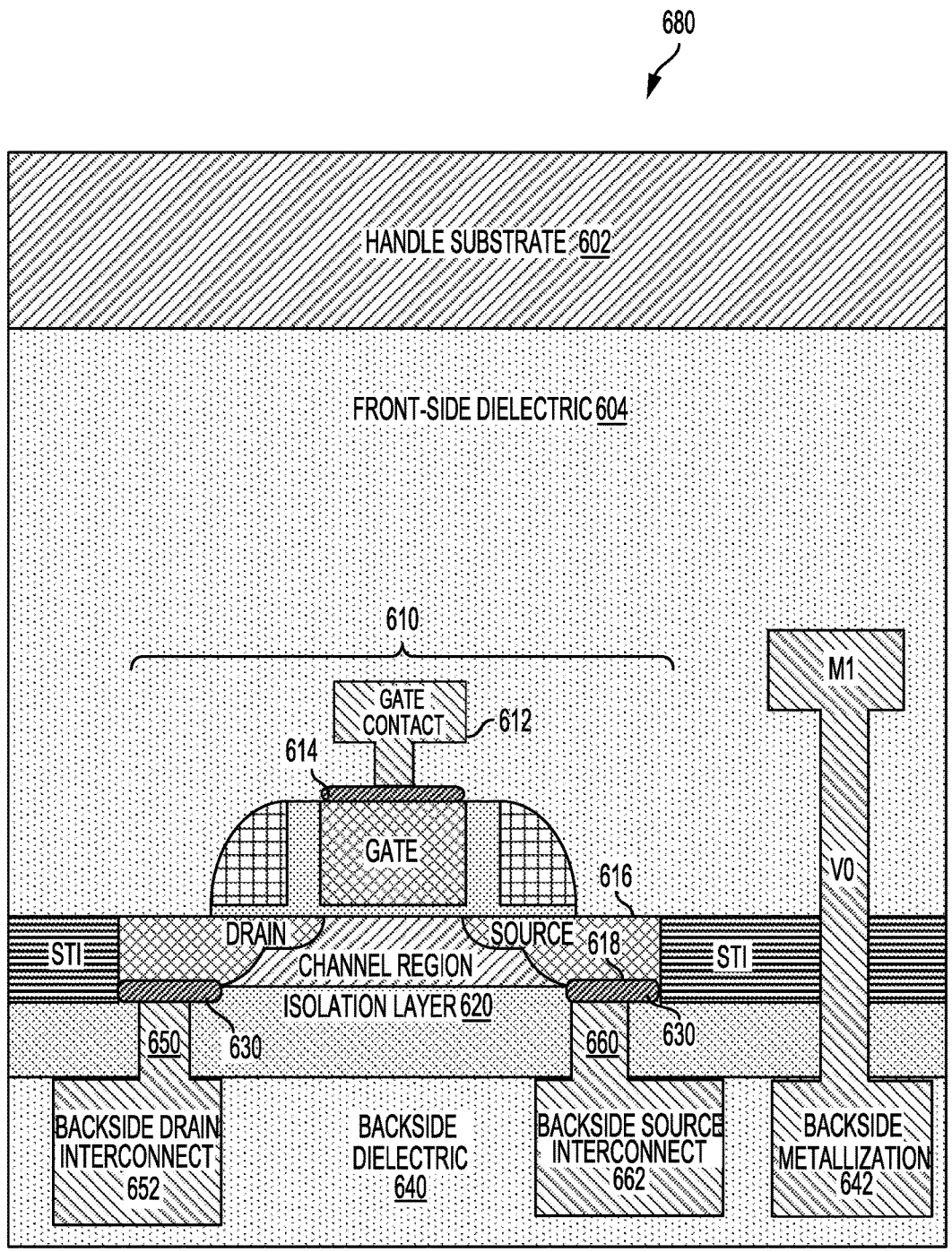

FIG. 6B is a cross-sectional view of an RFIC 680, in which a post-layer transfer process is also performed on the backside 618 of source/drain regions of an active device 610 (e.g., an LNA transistor), according to aspects of the present disclosure. As will be recognized, a configuration of the RFIC 680 is similar to the configuration of the RFIC 600 of FIG. 6A. In the configuration shown in FIG. 6B, however, the RFIC 680 includes a front-side metallization (e.g., a first BEOL interconnect (M1)) in the front-side dielectric layer 604. The front-side metallization M1 is coupled to a backside metallization 642 through a via V0. The backside metallization 642 is within the backside dielectric layer 640.

Figure 7A:
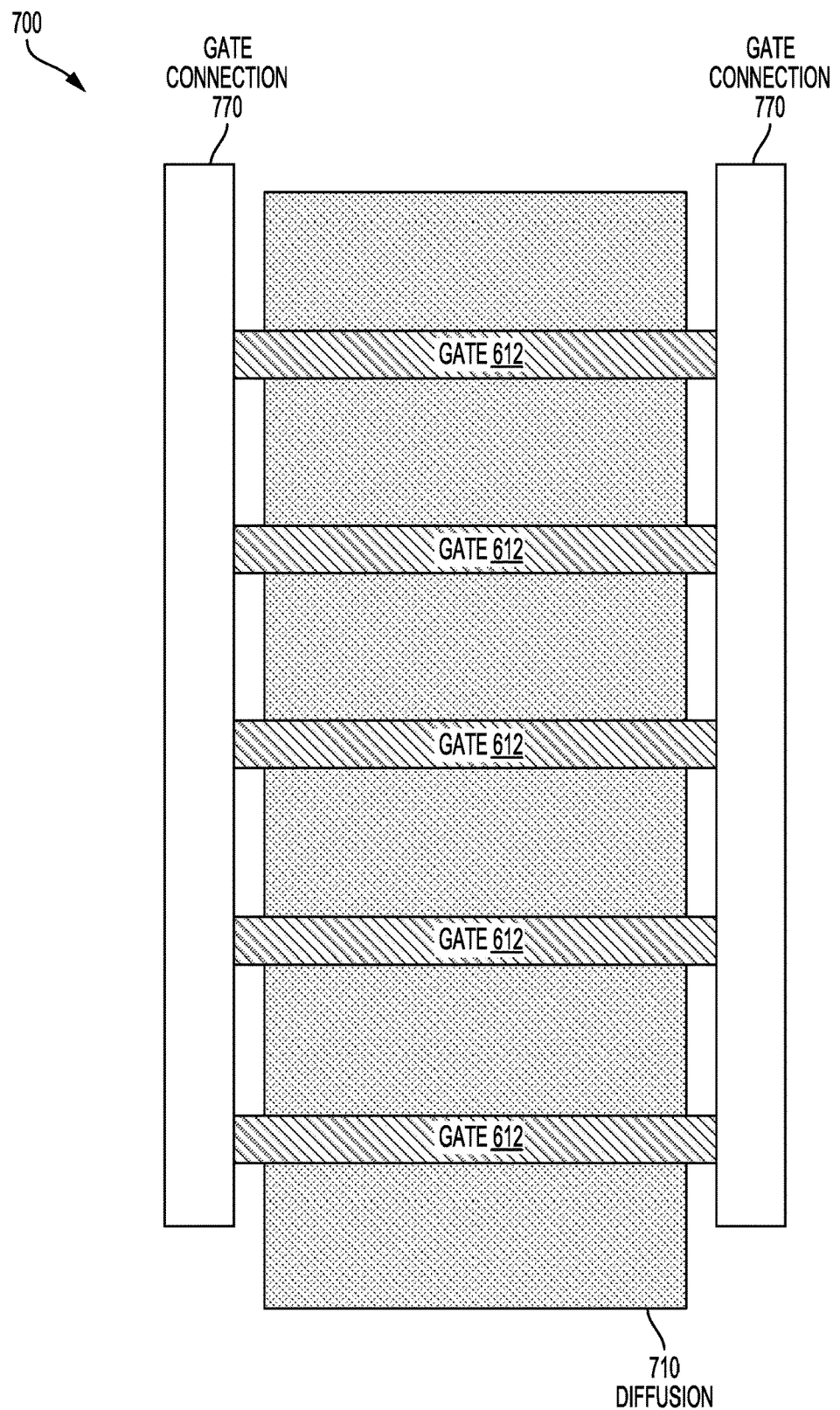
FIGS. 7A and 7B illustrate front-side routing for a low parasitic capacitance LNA, according to aspects of the present disclosure.
Figure 7B:
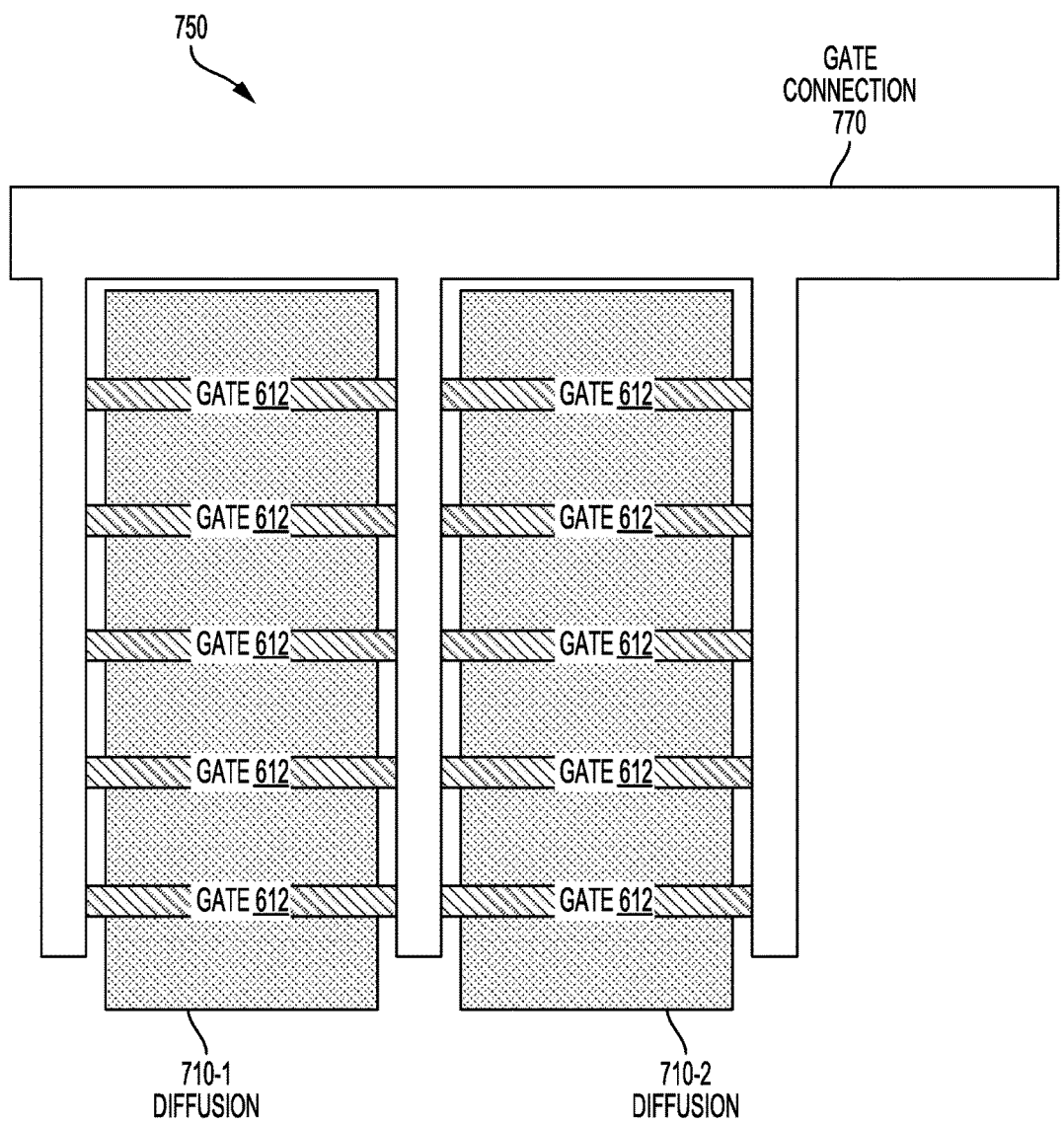
Figure 8A:
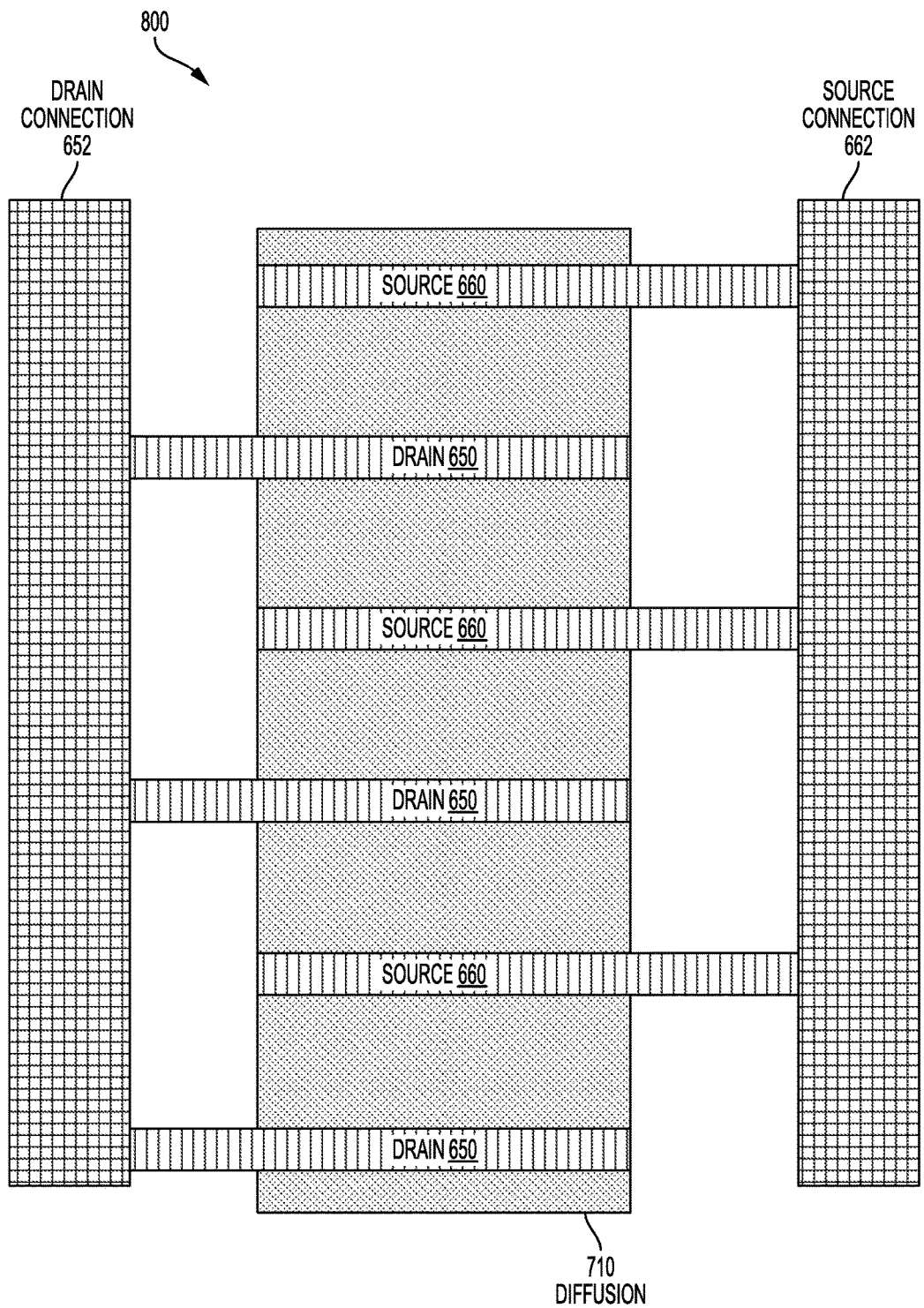
FIGS. 8A and 8B illustrate backside routing for a low parasitic capacitance LNA, according to aspects of the present disclosure.
Figure 8B:
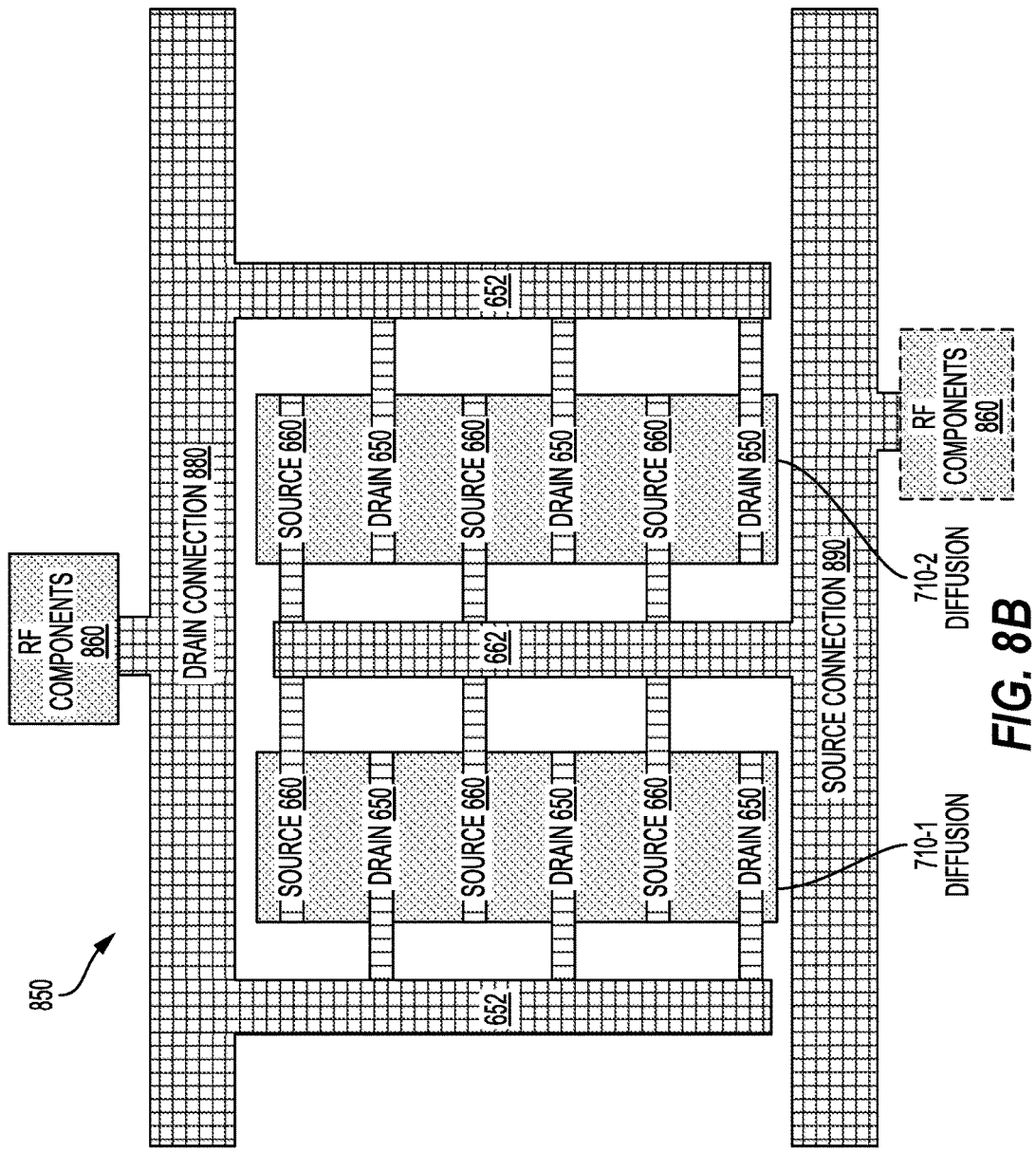

As shown in FIGS. 6A and 6B, the backside contact layer 630 is within the isolation layer 620 and enables contact with the backside drain contact 650 and the backside source contact 660. The relocating of the contacts/interconnects (e.g., the front-side drain contact 430 and the front-side source contact 432 of FIG. 4) to the backside 618 of the source/drain regions of the active device 610 helps prevent parasitic capacitance between the gate contact 612 of the active device 610 and conventional front-side source/drain contacts/interconnects. In this configuration, routing of the gate contact 612 is simplified, as shown in FIGS. 7A and 7B. Similarly, routing of the backside drain contact 650 and the backside source contact 660 is simplified, as shown in FIGS. 8A and 8B.

FIGS. 7A and 7B illustrate front-side routing for a low parasitic capacitance LNA, according to aspects of the present disclosure. In the configuration shown in FIG. 7A, a front-side routing 700 of an LNA is shown for a single diffusion island configuration. In this example, the LNA is configured to include an LNA transistor, for example, as shown in FIG. 6A. Representatively, each gate contact 612 on a diffusion island 710 is routed to a gate connection 770. This configuration helps eliminate the parasitic capacitance shown in FIG. 5.

FIG. 7B shows a front-side routing 750 of an LNA for a dual diffusion island configuration. In this example, the LNA is also configured to include the LNA transistor shown in FIG. 6A. Representatively, each gate contact 612 on a first diffusion island 710-1 and a second diffusion island 710-2 is routed to the gate connection 770 for eliminating drain-to-gate parasitic capacitance. This LNA configuration uses multiple diffusion islands (e.g., 710-1 and 710-2) to compensate for increased gate resistance.

Routing the source/drain connections opposite from the gate connections supports LNAs fabricated using multiple diffusion islands by simplifying routing of the active devices. In particular, contact-to-gate capacitance and parasitic resistance are incurred due to the overlapping source/drain and gate contact routing. Substantially reducing parasitic capacitance, as well as gate resistance, provides a substantial improvement (e.g., a 20% to 40% improvement) in a gain bandwidth product (FT) as well as a maximum frequency of oscillation ($F_{max}$) for supporting 5G communication enhancements.

FIGS. 8A and 8B illustrates backside routing for a low parasitic capacitance LNA, according to aspects of the present disclosure. In the configuration shown in FIG. 8A, a backside routing 800 of the LNA in the single diffusion island configuration of FIG. 7A is shown. This example also incorporates the LNA transistor as shown in FIG. 6A. Representatively, each backside drain contact 650 on the diffusion island 710 is routed to a drain interconnect 652. In addition, each backside source contact 660 on the diffusion island 710 is routed to the backside BEOL source interconnect 662. Replacing front-side source and drain contacts with the backside source and drain contacts eliminates the parasitic capacitance (e.g., drain-to-gate capacitance ($C_{DG}$)) shown in FIG. 5.

FIG. 8B shows a backside routing 850 of the LNA for the dual diffusion island configuration shown in FIG. 7B. Representatively, each backside drain contact 650 on the first diffusion island 710-1 and the second diffusion island 710-2 is routed to a drain connection 880. Similarly, each backside source contact 660 on the first diffusion island 710-1 and the second diffusion island 710-2 is routed to a source connection 890 for eliminating parasitic capacitance. This LNA configuration uses multiple diffusion islands (e.g., 710-1 and 710-2) for decreasing gate resistance to enable support for 5G communication enhancements.

This configuration of the LNA further illustrates radio frequency (RF) components 860 coupled to the drain connection 880 and optionally to the source connection 890. The RF components 860 may include resistor (R), inductor (L) and capacitor (C) (RLC) components. The RF components 860 may also include antennas, and other like RF components, for example, as shown in FIG. 2. Additional details regarding the RF components 860 for completing formation of the LNA are omitted to avoid obscuring the inventive features. It should be recognized that aspects of the present disclosure may include LNAs configured in cascode configurations, resistive configuration, or other like arrangements. Although the preceding description was with respect to planar transistors, the present disclosure also applies to other configurations, such as FinFETs.

Figure 9:
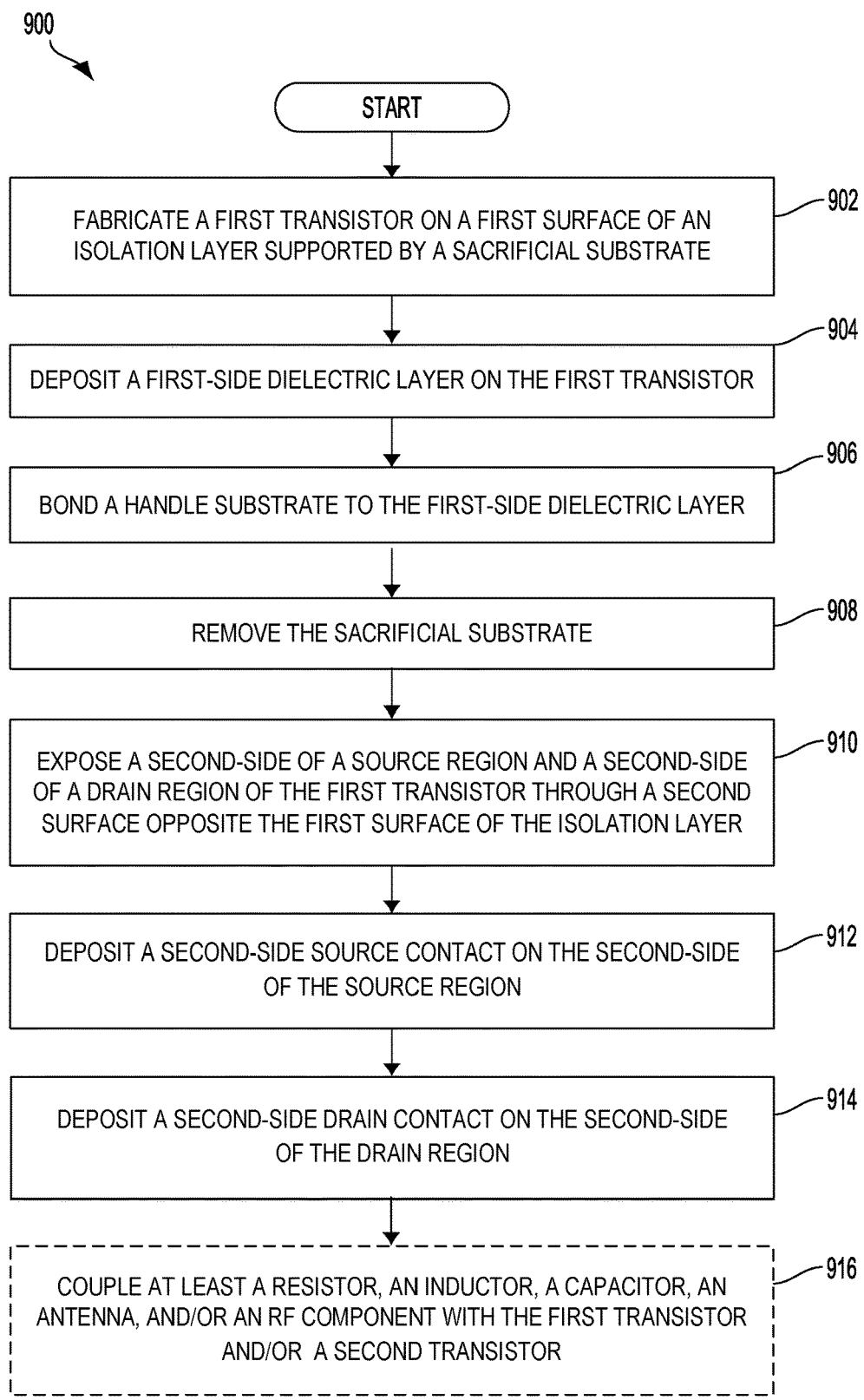
FIG. 9 is a process flow diagram illustrating a method of a backside silicidation process with layer transfer for constructing a RF integrated circuit including an LNA, according to an aspect of the present disclosure.

One aspect of the present disclosure uses a backside silicidation process with layer transfer to form backside source/drain contacts to the source/drain regions of an LNA transistor, for example, as shown in FIG. 9.

FIG. 9 is a process flow diagram illustrating a method 900 of constructing a low noise amplifier (LNA) device using a backside silicidation process with layer transfer, according to an aspect of the present disclosure. The method 900 begins at block 902, in which a first transistor is fabricated on a first surface of an isolation layer. The isolation layer is supported by a sacrificial substrate. For example, as shown in FIG. 3, an active device 310 is fabricated on a buried oxide (BOX) layer 320. In block 904, the front-side dielectric layer is deposited on the first transistor. For example, as shown in FIG. 6A, the front-side dielectric layer 604 is deposited on the active device 610.

Referring again to FIG. 9, in block 906, a handle substrate is bonded to the front-side dielectric layer. For example, as shown in FIG. 6A, a handle substrate 602 is bonded to the front-side dielectric layer 604. In block 908 of FIG. 9, the sacrificial substrate is removed. As shown in FIG. 3, the layer-transfer process includes removal of the sacrificial substrate 301. In block 910, a backside of a source region and a backside of a drain region of the first transistor are exposed through a second surface opposite the first surface of the isolation layer. For example, as shown in FIG. 6A, the backside 618 of the drain region and the source region are exposed by the post-layer transfer process.

In block 912 of FIG. 9, a backside source contact is deposited on the backside of the source region. In block 914, a backside drain contact is deposited on the backside of the drain region. For example, as shown in FIG. 6A, a backside contact layer 630 is deposited on the backside 618 of the source region and the drain region. In addition, a backside drain contact 650 is coupled to the backside 618 of the drain region through the backside contact layer 630. Similarly, a backside source contact 660 is coupled to the backside 618 of the source region through the backside contact layer 630. In block 916 of FIG. 9, at least one of a resistor, an inductor, a capacitor, an antenna and/or an RF components is optionally coupled with the first transistor and/or a second transistor, for example, as shown in the RF components 860 of FIG. 8B.

Aspects of the present disclosure describe a backside silicidation design to reduce parasitic capacitance of a low noise amplifier in an RF integrated circuit. One aspect of the present disclosure uses a backside silicidation process with layer transfer to form backside source/drain contacts (e.g., a backside silicide contact) to the source/drain regions of a transistor. The backside silicidation process may form a via coupled to a first source/drain region of the transistor through the backside source/drain contact. The via may extend through an isolation layer and into a backside dielectric layer supporting the isolation layer. In addition, a post-layer transfer metallization process enables the formation of a backside metallization coupled to the via. A front-side metallization, distal from the backside metallization, may be coupled to a gate contact of the gate of the transistor.

Rearrangement of the BEOL interconnects/MOL contacts may reduce the parasitic capacitance caused by the proximity of the BEOL interconnects/MOL contacts and the transistor gate contacts. The front-side and backside may each be referred to as a first-side or a second-side. In some cases, the front-side will be referred to as the first-side. In other cases, the backside will be referred to as the first-side. Although the description is with respect to an LNA, it is contemplated that these structures would also improve a power amplifier (PA).

According to a further aspect of the present disclosure, RF integrated circuitry, including backside silicide contacts on source/drain regions of transistors, is described. The RF integrated circuitry includes a transistor on a first surface of an isolation layer, including a front-side dielectric layer on the transistor. The RF integrated circuit structure also includes means for handling the RF integrated circuitry on the front-side dielectric layer. The handling means may be the handle substrate, shown in FIG. 3. In another aspect, the aforementioned means may be any layer, module or any apparatus configured to perform the functions recited by the aforementioned means.

Figure 10:
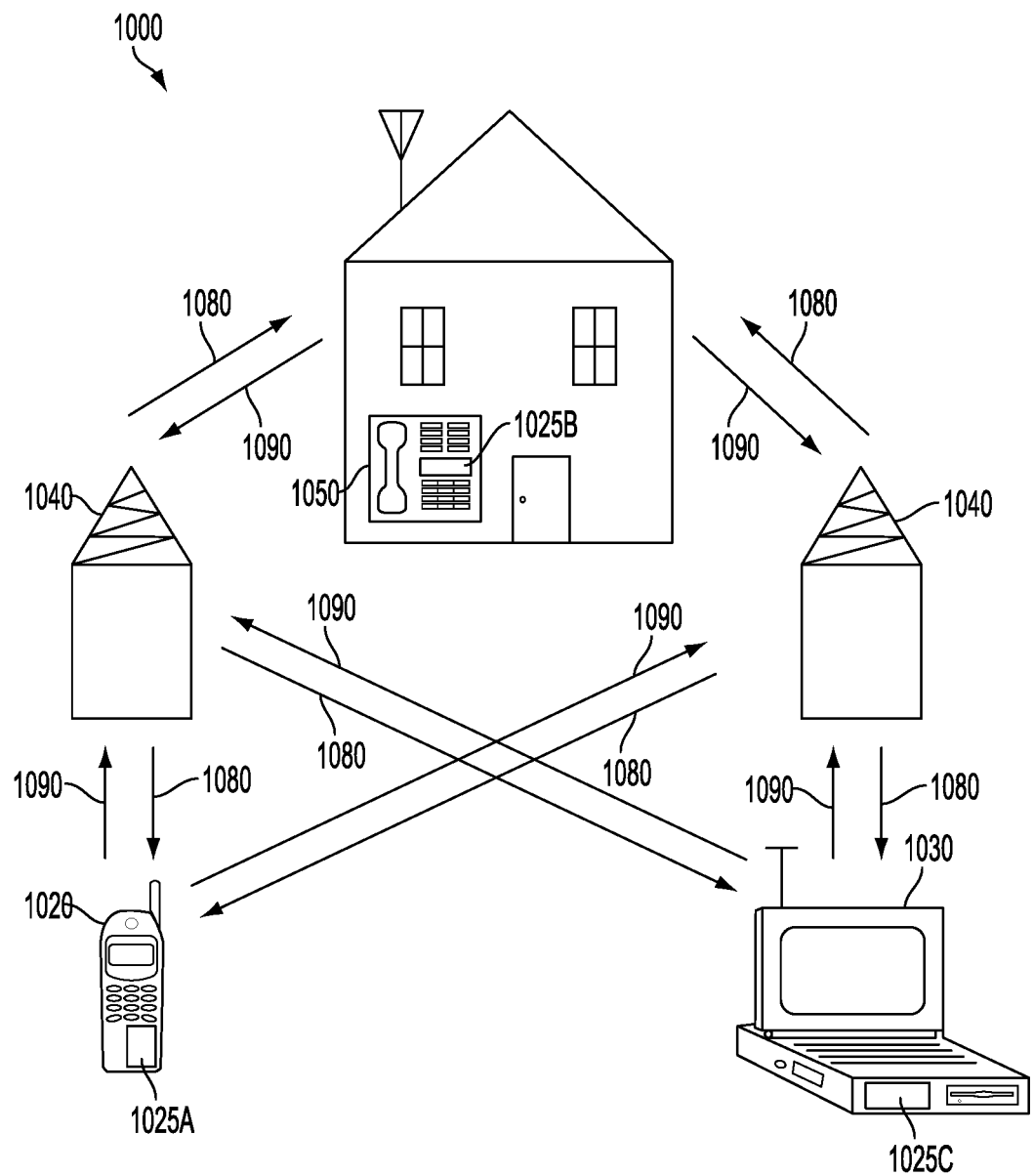
FIG. 10 is a block diagram showing an exemplary wireless communication system in which an aspect of the present disclosure may be advantageously employed.

FIG. 10 is a block diagram showing an exemplary wireless communication system 1000 in which an aspect of the present disclosure may be advantageously employed. For purposes of illustration, FIG. 10 shows three remote units 1020, 1030, and 1050 and two base stations 1040. It will be recognized that wireless communication systems may have many more remote units and base stations. Remote units 1020, 1030, and 1050 include IC devices 1025A, 1025C, and 1025B that include the disclosed low noise amplifier (LNA) device. It will be recognized that other devices may also include the disclosed LNA, such as the base stations, switching devices, and network equipment. FIG. 10 shows forward link signals 1080 from the base station 1040 to the remote units 1020, 1030, and 1050 and reverse link signals 1090 from the remote units 1020, 1030, and 1050 to base stations 1040.

In FIG. 10, remote unit 1020 is shown as a mobile telephone, remote unit 1030 is shown as a portable computer, and remote unit 1050 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 10 illustrates remote units according to the aspects of the present disclosure, the present disclosure is not limited to these exemplary illustrated units. Aspects of the present disclosure may be suitably employed in many devices, which include the disclosed LNA.

Figure 11:
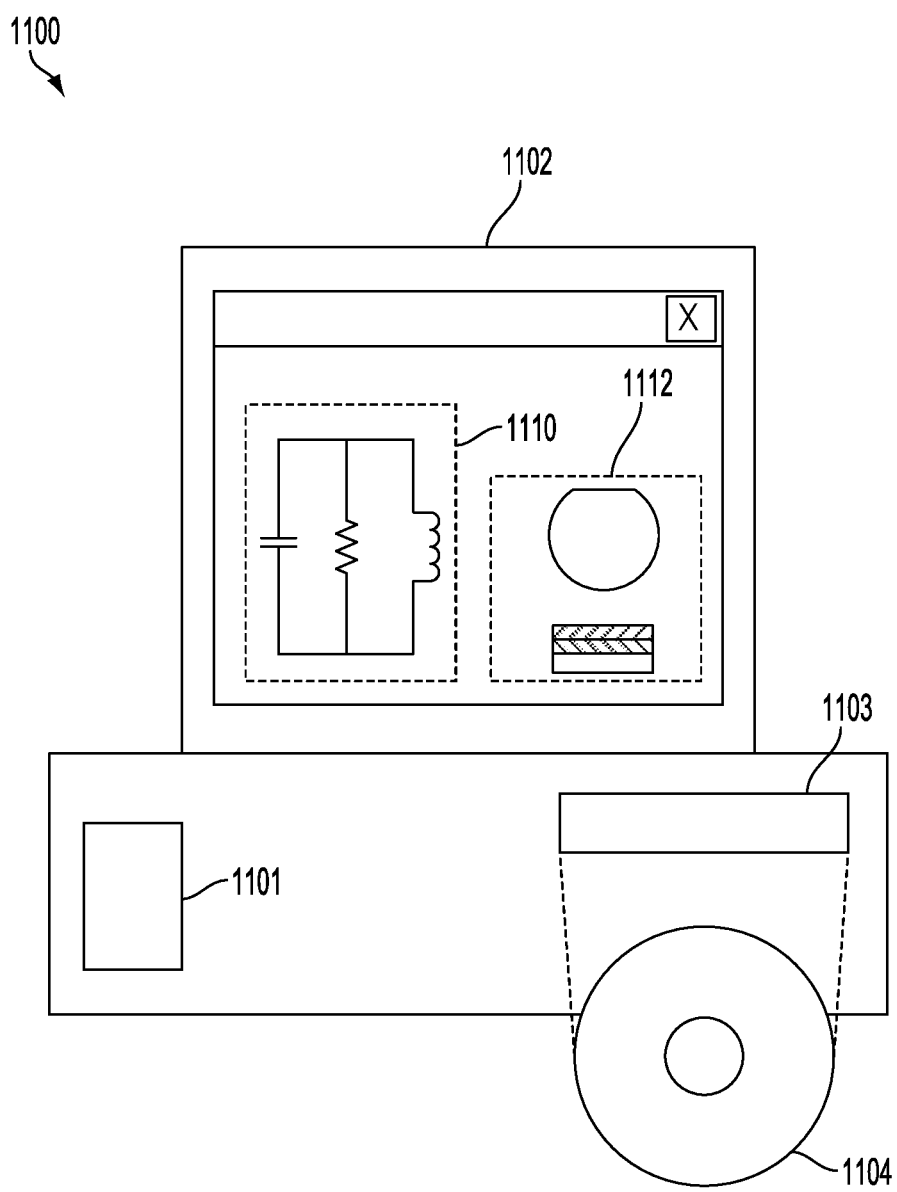
FIG. 11 is a block diagram illustrating a design workstation used for circuit, layout, and logic design of a semiconductor component, such as the RF devices disclosed above.

FIG. 11 is a block diagram illustrating a design workstation used for circuit, layout, and logic design of a semiconductor component, such as the RFIC disclosed above. A design workstation 1100 includes a hard disk 1101 containing operating system software, support files, and design software such as Cadence or OrCAD. The design workstation 1100 also includes a display 1102 to facilitate a circuit design 1110 or an LNA design 1112 of an RF device. A storage medium 1104 is provided for tangibly storing the circuit design 1110 or the LNA design 1112. The circuit design 1110 or the LNA design 1112 may be stored on the storage medium 1104 in a file format such as GDSII or GERBER. The storage medium 1104 may be a CD-ROM, DVD, hard disk, flash memory, or other appropriate device. Furthermore, the design workstation 1100 includes a drive apparatus 1103 for accepting input from or writing output to the storage medium 1104.

Data recorded on the storage medium 1104 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1104 facilitates the circuit design 1110 or the LNA design 1112 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to any types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the present disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A low noise amplifier (LNA) device, comprising:
a first transistor on a semiconductor on insulator (SOI) layer, the first transistor including a source region, a drain region, and a gate;
a first-side gate contact coupled to the gate;
a second-side source contact coupled to the source region;
a second-side drain contact coupled to the drain region;
a first via coupled to the source region through the second-side source contact, the first via extending through an isolation layer of the SOI layer and into a second-side dielectric layer supporting the isolation layer; and
a second via coupled to the drain region through the second-side drain contact, the second via extending through the isolation layer of the SOI layer and into the second-side dielectric layer.

2. The LNA device of claim 1, in which a first-side comprises a front-side of the first transistor, and a second-side comprises a backside of the first transistor.

3. The LNA device of claim 1, in which a second-side comprises a front-side of the first transistor, and a first-side comprises a backside of the first transistor.

4. The LNA device of claim 1, in which the second-side source contact and/or the second-side drain contact comprises a silicide contact layer.

5. The LNA device of claim 1, further comprising a first-side back-end-of-line (BEOL) interconnect coupled to the first-side gate contact and arranged in a first-side dielectric layer.

6. The LNA device of claim 1, in which the first transistor further comprising
a handle substrate on a first-side dielectric layer or the second side dielectric layer.

7. The LNA device of claim 1, further comprising at least one radio frequency (RF) component coupled to the second-side source contact and/or the second-side drain contact.

8. The LNA device of claim 7, in which the at least one RF component comprises at least one of a resistor, an inductor, a capacitor, or an antenna.

9. The LNA device of claim 1, integrated into an RF front end module, the RF front end module incorporated into at least one of a music player, a video player, an entertainment unit, a navigation device, a communications device, a personal digital assistant (PDA), a fixed location data unit, a mobile phone, and a portable computer.

10. A method of constructing a low noise amplifier (LNA) device, comprising:
fabricating a first transistor on a first surface of an isolation layer supported by a sacrificial substrate, the first transistor comprising a gate coupled to a first-side gate contact;
depositing a first-side dielectric layer on the first transistor;
bonding a handle substrate to the first-side dielectric layer;
removing the sacrificial substrate;
exposing a second-side of a source region and a second-side of a drain region of the first transistor through a second surface opposite the first surface of the isolation layer;
depositing a second-side source contact on the second-side of the source region;
depositing a second-side drain contact on the second-side of the drain region;
fabricating a first via coupled to the source region through the second-side source contact, the first via extending through the isolation layer and into a second-side dielectric layer supporting the isolation layer; and
fabricating a second via coupled to the drain region through the second-side drain contact, the second via extending through the isolation layer and into the second-side dielectric layer.

11. The method of claim 10, further comprising coupling at least one radio frequency (RF) component to the second-side source contact and/or the second-side drain contact.

12. The method of claim 11, in which the at least one RF component comprises at least one of a resistor, an inductor, a capacitor, or an antenna.

13. The method of claim 10, further comprising fabricating a post-layer transfer metallization layer in the second-side dielectric layer and coupled to the second-side source contact and/or the second-side drain contact of the first transistor through the first via and/or the second via.

14. The method of claim 10, further comprising integrating the LNA device into an RF front end module, the RF front end module incorporated into at least one of a music player, a video player, an entertainment unit, a navigation device, a communications device, a personal digital assistant (PDA), a fixed location data unit, a mobile phone, and a portable computer.

15. A radio frequency (RF) front end module, comprising:
a low noise amplifier, comprising a first transistor on a semiconductor on insulator (SOI) layer, the first transistor including a source region, a drain region, and a gate, a first-side gate contact coupled to the gate, a second-side source contact coupled to the source region, a second-side drain contact coupled to the drain region, a first via coupled to the source region through the second-side source contact, the first via extending through an isolation layer of the SOT layer and into a second-side dielectric layer supporting the isolation layer, and a second via coupled to the drain region through the second-side drain contact, the second via extending through the isolation layer of the SOT layer and into the second-side dielectric layer; and
an antenna coupled to an output of the low noise amplifier.

16. The RF front end module of claim 15, in which a first-side comprises a front-side of the first transistor, and a second-side comprises a backside of the first transistor, the second-side being distal from the first-side.

17. The RF front end module of claim 15, in which a second-side comprises a front-side of the first transistor, and a first-side comprises a backside of the first transistor, the first-side being distal from the second-side.

18. The RF front end module of claim 15, in which the first transistor further comprises
a handle substrate on a first-side dielectric layer or the second-side dielectric layer.

19. The RF front end module of claim 15, further comprising at least one radio frequency (RF) component coupled to the second-side source contact and/or the second-side drain contact.

* * * * *